May 30, 1950 T. A. HUNTER 2,509,231

OSCILLATOR

Filed Feb. 15, 1945 2 Sheets-Sheet 1

Inventor:
Theodore A. Hunter,
By Christen, Wiles, Schroeder,
Merriam & Hofgren, Attys.

OSCILLATOR

Filed Feb. 15, 1945

Inventor:
Theodore A. Hunter,
By Chritton, Wiles, Schroeder, Merriam & Hofgren, Attys Patented May 30, 1950

2,509,231

UNITED STATES PATENT OFFICE 2,509,231

OSCILLATOR

Theodore A. Hunter, Iowa City, Iowa, assignor to Collins Radio Company, a corporation of Iowa Application February 15, 1945, Serial No. 577,957

8 Claims. (Cl. 250—36)

This invention relates to an oscillator, and more particularly to a hermetically sealed oscillator.

Figures 1, 2, 3, 4:
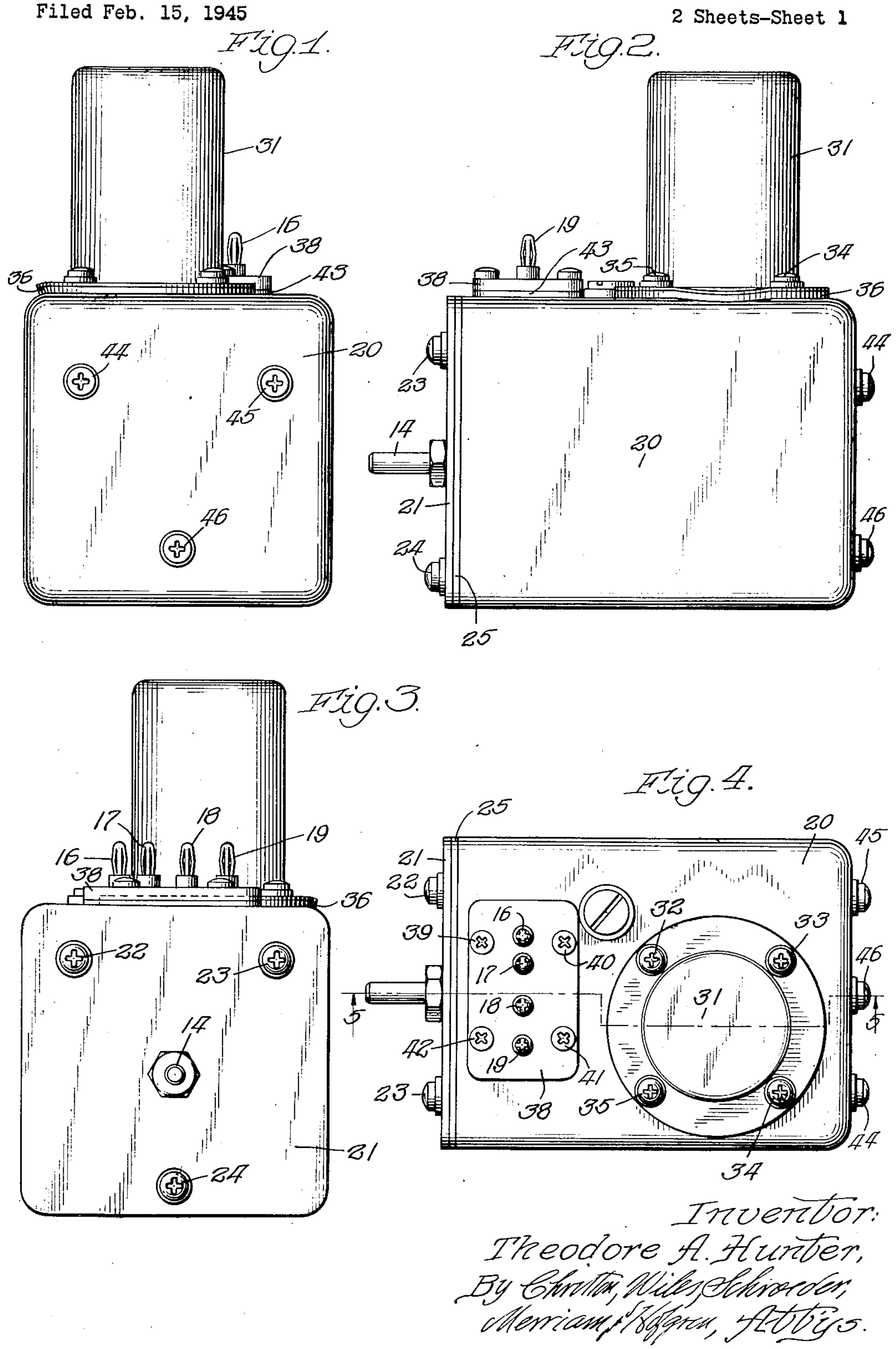
Figure 5:
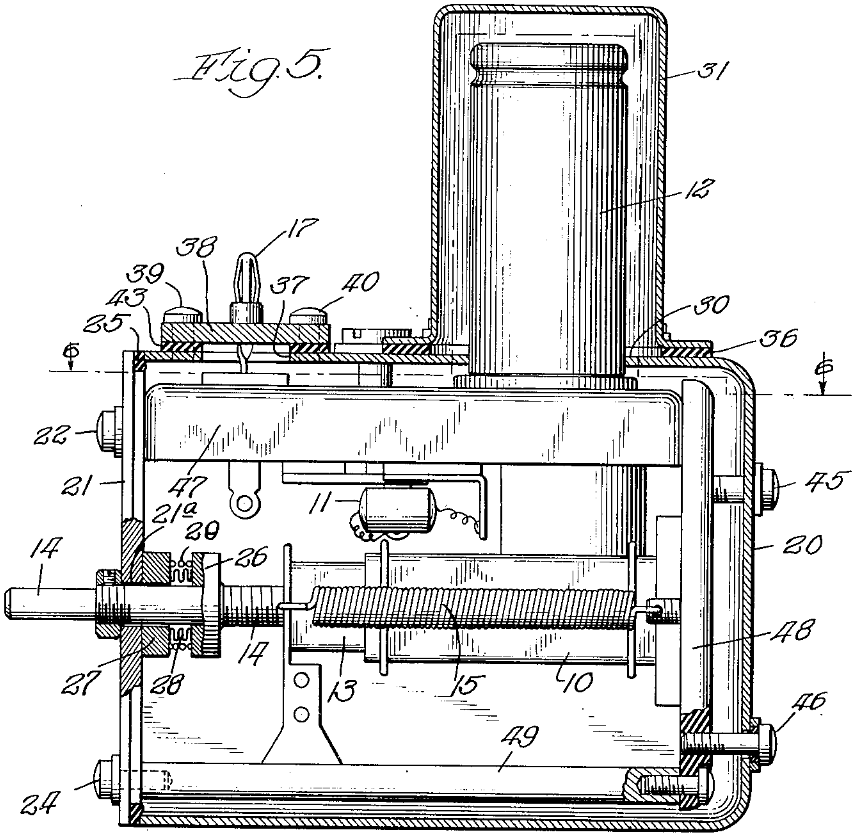
Figures 6, 7:
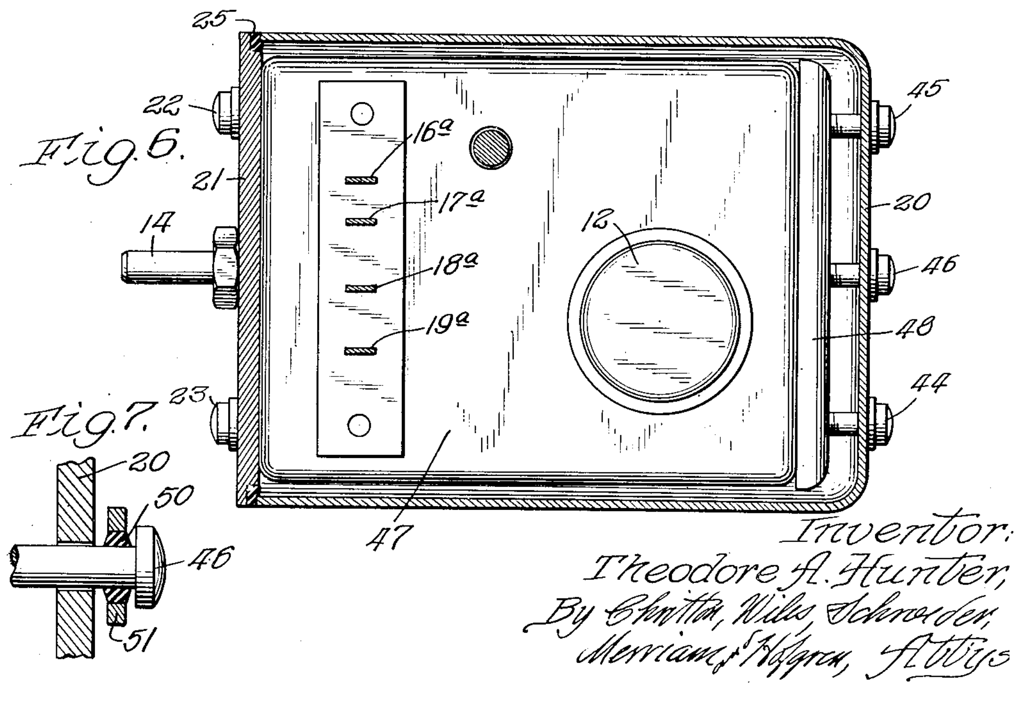

One feature of this invention is that it provides an improved variable frequency or tunable oscillator for radio apparatus; another feature of this invention is that instability of frequency of a tunable oscillator resulting from humidity variation is eliminated; yet another feature of this invention is that frequency variations resulting from pressure changes are eliminated; and still another feature of this invention is that it provides an improved oscillator particularly adapted for aircraft radio installations. Other features and advantages of this invention will be apparent from the following specification and the drawings, in which:

Figure 1 is a back elevational view of an oscillator unit embodying my invention; Figure 2 is a side elevational view of the device shown in Figure 1; Figure 3 is a front elevational view; Figure 4 is a top plan view of my device; Figure 5 is a vertical sectional view along the line 5—5 of Figure 4; Figure 6 is a horizontal sectional view along the line 6—6 of Figure 5, but showing the tube in elevation; and Figure 7 is a fragmentary detail view of one of the sealing arrangements associated with the mounting screws.

Modern radio equipment, both transmitting and receiving, makes use of an oscillator. In a transmitter, this oscillator is the primary source of the carrier wave, the oscillator output being amplified, generally after multiplication, through intermediate and final amplifiers. In a receiver, a local oscillator is generally heterodyned against the incoming signal to provide a wave of reduced or intermediate frequency. In fixed frequency installations the stability of oscillator frequency can be ensured by the use of crystal control, but this is not possible where the oscillator must be of the variable frequency or tuned type. Practically all receivers use a variable frequency oscillator and many types of transmitting equipment, as for example aircraft transmitting equipment, make use of a variable oscillator in order to enable selection of any desired channel throughout a given band or a plurality of bands.

Variable frequency oscillators have always presented a problem in frequency stability and calibration, and these problems are intensified in radio apparatus used in aircraft, for example. For best results, the variable frequency oscillator or oscillators used in aircraft radio installations should provide good frequency stability and accurate calibration despite the fact that the equipment may be subjected to high temperature and humidity on the landing strip of a South Pacific island, and the low temperatures, humidities and pressures encountered in flight at altitudes of five miles or more. Technicians may adjust and calibrate the equipment under ground level conditions, but the equipment is most important while the plane is in flight, under completely different conditions.

It has heretofore been thought that avoidance of change in calibration and prevention of frequency drift during operation was primarily a matter of overcoming changes due to temperature variations, and much work has been done in minimizing or eliminating frequency variations due to temperature changes by temperature compensation, as for example by varying the inductance of a tuned circuit by use of a bi-metal thermostatic arrangement. One such means which has proved very satisfactory in practice is shown in my copending application Serial No. 474,371, filed February 1, 1943, now Patent Number 2,439,809. I have found, however, that temperature compensation alone is not sufficient to prevent oscillator frequency variations, particularly under the adverse conditions encountered in aircraft radio equipment.

I have found that variations in humidity of the atmosphere around the oscillator are an important factor in frequency variations thereof; and that, to a lesser degree, variations in pressure result in some frequency deviation. Even though the impedance elements of a circuit, the mountings and forms, etc. are impregnated with wax in a manner now conventional to reduce the effect of humidity variations, variations in humidity still provide very appreciable frequency variations in an oscillator. In the first place, parts such as coil forms and insulating supports, even though wax impregnated, absorb enough moisture to cause both a physical volumetric change, with an attendant impedance change, and changes in the dielectric constant of the material. Furthermore, and apparently even more important as a factor in frequency variations, variations in the moisture suspended in the air increases the dielectric constant of the air and therefore varies the capacity in the oscillator circuit and particularly the distributed capacity of the coil. Water has a dielectric constant of about 81 as compared to unity for dry air, and the absolute quantity of moisture suspended in the air makes a very material difference in the capacity relationships existing between elements surrounded by that atmosphere. This appears to be a function of the absolute quantity of moisture in the air, rather than of any relative humidity.

I have found that I can obviate frequency variations of an oscillator due to humidity and pressure differences by housing the oscillator components in a hermetically sealed housing, preferably with substantially dry atmosphere therein as this also minimizes corrosion difficulties. The oscillator may be temperature compensated by thermostatic means, by use of a special temperature compensating coil, or the like; and when it is then hermetically sealed to obviate humidity and pressure changes, an exceedingly stable variable frequency or tunable oscillator is provided. While the provision of mounting and connecting arrangements, and a tuning drive, present problems in connection with hermetically sealing the oscillator components in a housing, I have overcome these difficulties and will now describe one embodiment of my invention.

In the particular embodiment of my invention illustrated in the accompanying drawings, the oscillator comprises as its principal components a permeability tuned coil 10, a fixed condenser 11, and a tube 12, which may be of a conventional three element type adapted to the voltages available. The coil 10 is illustrated as tuned by a core 13 of permeable material (as powdered iron in an appropriate insulating binder), this core being prevented from rotation by appropriate mechanical means and being threaded upon the threaded portion of a rotatable tuning shaft 14. The parts are preferably mechanically biased in one direction, as by the spring 15, and the inductance of the coil 10 is varied by rotation of the shaft 14. Such means of permeability tuning of an inductance coil are well known to the art and will not be further described here. Similarly, appropriate oscillator circuits are well known and no attempt is made to illustrate or describe the particular circuit used here, as any desired operable oscillator circuit may be employed, with tuning effected by variation of the capacity if desired. Input, output and power connections for the oscillator may be completed through four connection terminals here identified as 16–19.

The housing of the oscillator shown comprises as its main body portion a drawn aluminum cup 20 of rectangular shape closed by an end plate 21 sealed in place on the end of the cup by holding screws 22, 23 and 24, with an intermediate gasket 25 ensuring an airtight seal. As may be best seen in Figure 5, the end plate 21 is provided with a central shaft opening 21a adapted to have the tuning shaft 14 pass therethrough. An airtight seal permitting rotation of the shaft is provided by a seal of the Sylphon or metal bellows type comprising a member 26 rigidly mounted on the shaft 14 and a spaced annular member 27 adapted to bear against the inner surface of the end plate 21 with an airtight but movable seal, the parts 26 and 27 being sealed by an intermediate metal bellows 28 and the desired pressure of the member 27 against the inner surface of the end plate being effected by a spring 29. In this arrangement the members 26, 27, 28, and 29 all rotate with the shaft 14, and the contact between the inside face of end plate 21 and the adjoining face of the member 27 is such as to provide a fluid tight seal.

The main body portion of the housing and more particularly the cup 20, is also provided with other openings. The largest of these is an opening 30 in its top wall adapted to receive the tube 12. A cap portion 31 is adapted to close this opening when the tube is in place, the cap portion being fastened to the cup 20 by four screws here identified as 32–35, and intermediate gasket 36 providing an airtight seal between the cup 20 and the cap portion 31. The upper wall of the cup 20 is also provided with a connector opening here identified as 37, this opening being rectangular in shape and adapted to be covered by a connector plate or element here identified as 38. This element is of molded insulating material, as Bakelite, is held in place by four screws here identified as 39–42, and is sealed by a gasket 43.

The back wall of the cup 20 is provided with openings adapted to receive mounting screws here identified as 44–46, these and the front end plate screws 22–24 serving to mount the inner chassis members or mounting elements best seen in Figure 5 and here identified as 47, 48 and 49, these elements serving to carry the tube base, the impedance elements, etc., connections being made from the external connector prongs or terminals 16–19, through connector strips 16a–19a to the wiring of the oscillator circuit. In order to ensure an airtight seal about the various screws passing through openings in the housing, I provide sealing means best illustrated in Figure 7, a fragmentary detail view of the sealing means associated with the mounting screw 46. I employ a piece of resilient material 50, as rubber, within an annular metal washer 51. The resilient material 50 is so proportioned and formed that it has a central opening with a diameter which, in unstressed condition, is much smaller than the diameter of the shank of the mounting screw 46. I then force the mounting screw into this resilient material to expand it as illustrated in Figure 7, and tightening of the screw in place forces the resilient material tightly into the opening about the shank of the screw to provide a very effective airtight seal in a manner which yet enables convenient assembling of the oscillator parts. In order to ensure substantially complete freedom of moisture from the air enclosed within the housing as it is sealed up, I preferably drop in a small amount of a desiccating chemical.

It will be understood that the foregoing description is that of only a single specific embodiment of my invention, an embodiment which has been designed for aircraft radio equipment. While I have shown and described only one particular embodiment of my invention, it is to be understood that it is capable of many modifications. Changes, therefore, in the construction and arrangement may be made without departing from the spirit and scope of the invention as disclosed in the appended claims.

I claim:

1. In radio apparatus, an oscillator housing including: a body portion having a shaft opening in one wall adapted to have a rotatable shaft pass therethrough and an opening adapted to receive a tube with the major portion thereof projecting through said opening; means for hermetically sealing said wall and shaft while permitting rotation of the latter; a cap portion adapted to cover said tube opening; and means for hermetically sealing said body and cap portions.

2. In radio apparatus, an oscillator housing including: a body portion having a shaft opening in one wall adapted to have a rotatable shaft pass therethrough, mounting screw openings, and an opening adapted to receive a tube with the major portion thereof projecting through said opening;

means for hermetically sealing said wall and shaft while permitting rotation of the latter; a cup-like cap portion adapted to cover said tube opening; means for hermetically sealing said body and cap portions; and means for hermetically sealing a mounting screw in each of said screw openings.

3. In radio apparatus, an oscillator housing including: a body portion having a shaft opening in one wall adapted to have a rotatable shaft pass therethrough, mounting screw openings, and an opening adapted to receive a tube with the major portion thereof projecting through said opening; means for hermetically sealing said wall and shaft while permitting rotation of the latter; a cup-like cap portion adapted to cover said tube opening; means for hermetically sealing said body and cap portions; and means for hermetically sealing a mounting screw in each of said screw openings, this means comprising a washer of resilient material surrounded by a metal ring member.

4. In radio apparatus, an oscillator housing including: a metal body portion having a shaft opening in one wall adapted to have a rotatable shaft pass therethrough, a connector plate opening, mounting screw openings, and an opening adapted to receive a tube with the major portion thereof projecting through said opening; means for hermetically sealing said wall and shaft while permitting rotation of the latter; a cup-like cap portion adapted to cover said tube opening; means for hermetically sealing said body and cap portions; a connector plate of insulating material; means for hermetically sealing said connector plate to said body portion about said connector plate opening; and means for hermetically sealing a mounting screw in each of said screw openings.

5. An oscillator unit having a moisture-sealed enclosing housing containing an electron tube oscillator and at least one adjustable tuning element for controlling the frequency of said oscillator, said housing having a main body section for housing said tuning element and an auxiliary section laterally offset with respect to said body section for housing said electron tube, adjustable shaft means extending through a wall of said main body section, and means to seal the opening in said wall through which said shaft extends but without interfering with the adjusting movement of said shaft.

6. Apparatus of the character described in claim 5 in which said auxiliary section is removably attached to an external wall of said main body portion to permit insertion of said tube through an opening in said wall, and a moisture-proof seal is provided between said auxiliary section and the margin of said opening.

7. In radio apparatus, an oscillator housing including: a body portion having a shaft opening in one wall and an opening adapted to receive a tube; a shaft rotatable in said shaft opening; an hermetic sealing device in rotatable sealing engagement with said wall and yieldable sealing engagement with said shaft; a cap portion covering said tube opening and providing a casing for a tube outside the confines of said body portion; and means for hermetically sealing said body and cap portions.

8. In radio apparatus, an oscillator housing including: a body portion having a shaft opening in one wall and a tube opening adapted to receive a tube with the major portion thereof projecting through said opening; a cup-like cap portion adapted to cover said tube opening; means for hermetically sealing said body and cap portions; a shaft rotatable in said shaft opening; and a hermetic sealing device having a surface in rotatable sealing engagement with a plane inner surface of the wall about said shaft opening, at least one of the engaging surfaces being of metal, and said sealing device having a portion in yieldable sealing engagement with said shaft.

THEODORE A. HUNTER.

REFERENCES CITED

The following references are of record in the file of this patent:

UNITED STATES PATENTS

| Number | Name | Date |
|---|---|---|
| 1,825,918 | Peltier | Oct. 6, 1931 |
| 1,912,265 | Dow | May 30, 1933 |
| 1,912,926 | Wegener | June 6, 1933 |
| 2,077,954 | Ramclow | Apr. 20, 1937 |
| 2,097,868 | Beard | Nov. 2, 1937 |
| 2,104,596 | Muth | Jan. 4, 1938 |
| 2,175,025 | Hooven | Oct. 3, 1939 |
| 2,204,166 | Usselman | June 11, 1940 |
| 2,264,983 | Karlberg | Dec. 2, 1941 |
| 2,344,238 | Finch | Mar. 14, 1944 |
| 2,354,908 | Binneweg, Jr. | Aug. 1, 1944 |
| 2,360,372 | Snyder | Oct. 17, 1944 |
| 2,392,900 | Binneweg, Jr. | Jan. 15, 1946 |
| 2,403,298 | Payne | July 2, 1946 |
| 2,422,381 | White | June 17, 1947 |

FOREIGN PATENTS

| Number | Country | Date |
|---|---|---|
| 514,988 | Germany | Dec. 22, 1930 |
| 337,551 | Great Britain | Nov. 6, 1930 |